United States Patent
Hsu (10) Patent No.: US 10,043,857 B2
(45) Date of Patent: Aug. 7, 2018

(54) DISPLAY PANEL, FABRICATING METHOD THEREOF AND DISPLAY DEVICE

(71) Applicants: BOE Technology Group Co., Ltd., Beijing (CN); HEFEI Xinsheng Optoelectronics Technology Co., Ltd., Hefei (CN)

(72) Inventor: Minghung Hsu, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/270,217

(22) Filed: Sep. 20, 2016

(65) Prior Publication Data

US 2017/0194381 A1    Jul. 6, 2017

(30) Foreign Application Priority Data

Jan. 5, 2016    (CN) .......................... 2016 1 0005160

(51) Int. Cl.
*H01L 27/32* (2006.01)
*H01L 51/56* (2006.01)

(52) U.S. Cl.
CPC ........ *H01L 27/322* (2013.01); *H01L 27/3209* (2013.01); *H01L 27/3213* (2013.01); *H01L 27/3246* (2013.01); *H01L 27/3272* (2013.01); *H01L 27/3283* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 2005/0275343 | A1  | 12/2005 | Tanaka et al. |
| 2006/0108592 | A1  | 5/2006  | Nishimura et al. |
| 2013/0335680 | A1* | 12/2013 | Su ........................ H01L 51/5036 349/69 |
| 2015/0102331 | A1* | 4/2015  | Seo ........................ H01L 51/504 257/40 |
| 2015/0380470 | A1* | 12/2015 | Lee ...................... H01L 27/3213 257/40 |
| 2016/0049426 | A1* | 2/2016  | Lim ...................... H01L 27/124 257/72 |
| 2017/0186823 | A1* | 6/2017  | Kim ..................... H01L 27/3213 |

FOREIGN PATENT DOCUMENTS

CN        1776919 A        5/2006
KR    1020120042549 A1    5/2012

OTHER PUBLICATIONS

Dec. 15, 2017—(CN) First Office Action Appn 201610005160.4 with English Tran.

* cited by examiner

*Primary Examiner* — Joseph Schoenholtz
(74) *Attorney, Agent, or Firm* — Banner & Witcoff, Ltd.

(57) ABSTRACT

A display panel, a fabricating method thereof and a display device are disclosed, the display device includes a plurality of pixels. Each pixel comprises: a white sub pixel comprising a tandem white OLED; and a color filter layer, disposed at the light exit side of the white sub pixel and disposed outside and along at least one side of the white sub pixel. The display panel can reduce color drift in a side view and improve viewing effect.

20 Claims, 5 Drawing Sheets

DISPLAY PANEL, FABRICATING METHOD THEREOF AND DISPLAY DEVICE

This application claims priority to and the benefit of Chinese Patent Application No. 201610005160.4 filed on Jan. 5, 2016, which application is incorporated herein in its entirety.

TECHNICAL FIELD

Embodiments of the present disclosure relates to a display panel, a display device and a fabricating method of the display panel.

BACKGROUND

Tandem white OLEDs (organic light emitting diodes) have advantages such as high efficiency, no need of fine metal mask (FMM) or other complex patterning processes, capability of mass production and realizing a full color display. Thus, the tandem white OLEDs have a wide application prospect and have drawn extensive attention.

However, applying a plurality of (for example, two or three) kinds of light emitting materials in a same component results in some problems. One micro-resonant optical cavity in one component has only one resonant cavity length; it is difficult to optimize a plurality of kinds of light emitting layers, especially in the case of a big angle of view, which results in color drift at different angle of views in the device applying tandem white OLEDs. Especially for the structure applying more than three light emitting layers, for instance, the structure applying B/Y/B (blue/yellow/blue) light emitting layers, in the case of a big angle of view, the light emitting layer far from the reflective plane is prone to suffer from large color drift because of the change of optical interference condition. Thus, the device shows an obvious color drift, and even through the structure has been optimized, the color drift can not be avoided, and thus there is great difference between the color temperature in a front view and the color temperature in a side view.

SUMMARY

An embodiment of the present disclosure provides a display panel comprising a plurality of pixels. Each pixel comprises a white sub pixel comprising a tandem white organic light emitting diode (OLED); a color filter layer, disposed at the light exit side of the white sub pixel and disposed outside and along at least one side of the white sub pixel.

Another embodiment of the present disclosure provides a display device comprising the display panel mentioned above.

Another embodiment of the present disclosure provides a fabricating method of a display panel comprising: forming a color filter layer on the base substrate; forming a planarization layer on the color filter layer; forming a white sub pixel on the planarization layer. Forming of the white sub pixel comprises: forming a first electrode layer on the planarization layer; forming a tandem white OLED on the first electrode layer, forming a second electrode layer comprising a reflective material on the tandem white OLED.

Another embodiment of the present disclosure provides a fabricating method of a display panel comprising: forming a first electrode layer comprising a reflective material on a base substrate; forming a tandem white OLED on the first electrode layer; forming a second electrode layer on the tandem white OLED; forming a color filter layer on the second electrode layer.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
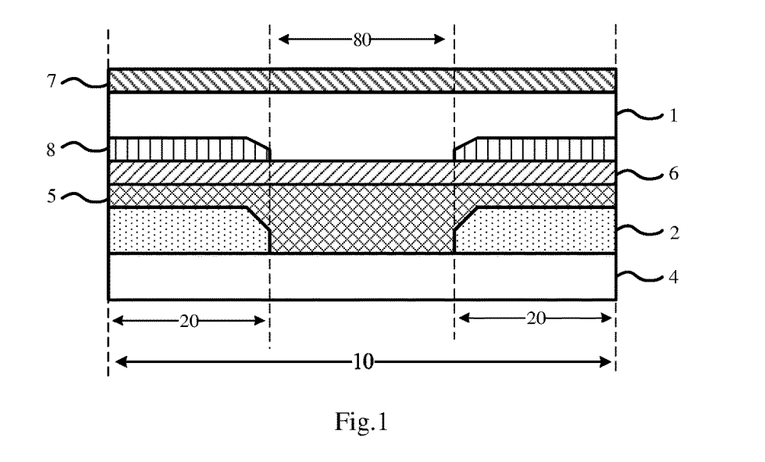
FIG. 1 is a structure schematic view of a display panel according to an embodiment of the present disclosure.

As shown in FIG. 1, a display panel according to an embodiment of the present disclosure comprises a plurality of pixels. Each pixel comprises a white sub pixel and a color filter layer. The white sub pixel comprises a tandem white organic light emitting diode (OLED) 1. The color filter layer 2 is disposed at the light exit side of the white sub pixel, and is disposed outside and along at least one side of the white sub pixel. The pixels constitute a pixel array. For example, the white sub pixel may include a tandem white OLED, but the embodiments of the disclosure are not limited thereto. For example, the display panel further comprises a base substrate 4, and an orthographic projection (corresponding to a region 20 of the base substrate 4 in FIG. 1) of the color filter layer 2 on the base substrate 4 is within an orthographic projection (corresponding to a region 10 of the base substrate 4 in FIG. 1) of the tandem white organic light emitting diode on the base substrate.

For example, a andem white OLED may include a plurality of light-emitting layer that are sequentially stacked between an anode and a cathode, and these light-emitting layers may include a red light-emitting layer, a green light-emitting layer, and a blue light-emitting layer, and light from these light-emitting layers can be mixed to obtain white light or substantially white light.

The structure according to the present embodiment is not only suitable for a top-emitting OLED, but also suitable for a bottom-emitting OLED. A structure of a bottom-emitting OLED, which is taken as an example, is described as follows for illustrating the viewing effect of the present embodiment.

Figure 2:
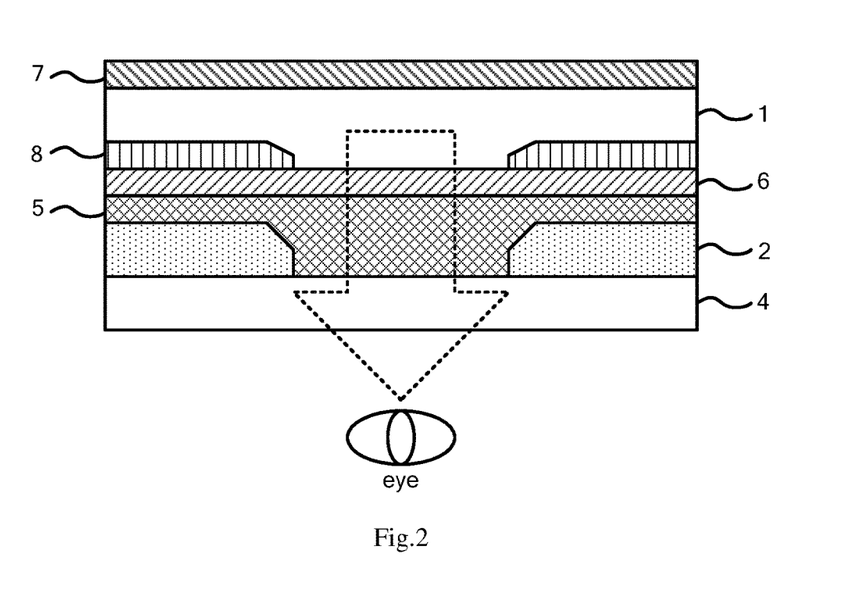
FIG. 2 is a schematic view of a front view according to an embodiment of the present disclosure.

When a viewer watches the display panel according to the present disclosure, as shown in FIG. 2, if the viewer watches a white sub pixel of the display panel vertically, the light emitting from the white sub pixel of the display panel enters the viewer's eyes while not passing through the color filter layer. Thus the viewer can see a pure white light.

Figure 3:
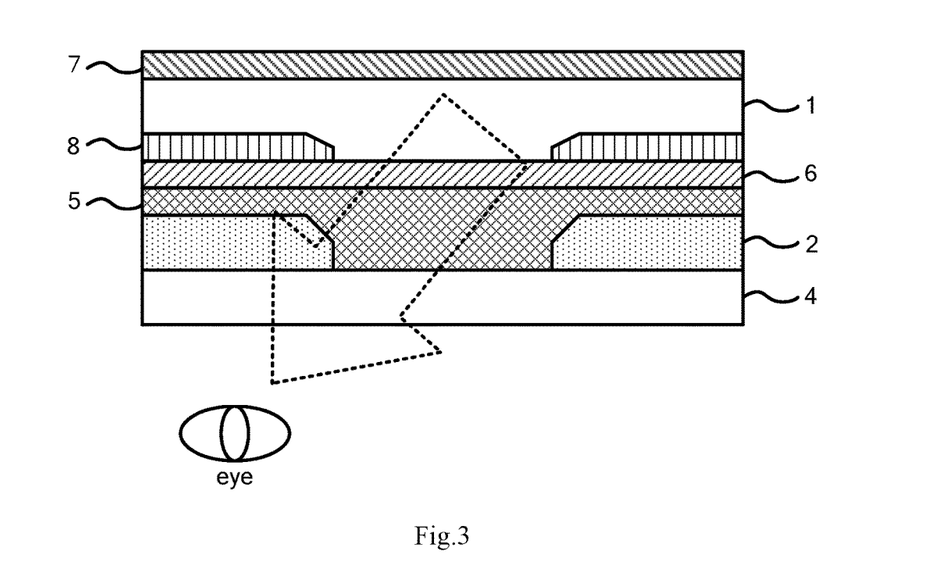
FIG. 3 is a schematic view of a side view according to an embodiment of the present disclosure.

If a viewer watches a white sub pixel of the display panel in a side view (not vertically), as shown in FIG. 3, the light emitted from the white sub pixel of the display panel at least partially passes through the color filter layer 2 before entering the viewer's eyes. Thus the viewer can see part of the light with the color corresponding to the color filter layer 2. The light with the color corresponding to the color filter neutralizes part of the color drift which is felt when the viewer is in a side view. Thus the color drift is reduced and the viewing effect and experience is improved.

For example, if the blue band light component of the white light emitted from the tandem white OLED is strong, the color filter layer 2 is a cool-toned color filter layer; if the green band light component of the white light emitted from the tandem white OLED is strong, the color filter layer 2 is a warm-toned color filter layer.

Because the white light is the combination of a variety of bands of light component, for example, if the blue band light component of the white light emitted from the tandem white OLED is strong, when the tandem white OLED is viewed from a side, a spectrum in a side view is in blue shift, and the color in a side view is in yellowing or yellow color drift, thus a warm-toned color drift is produced. For example, if the green band light component of the white light emitted from the tandem white OLED is strong, when the tandem white OLED is viewed from a side, a spectrum in a side view is in blue shift, and the color in a side view is in blue color drift, thus a cool-toned color drift is produced.

As for different tandem white OLEDs, different color filter layers can be disposed, which facilitates to neutralize the color drift in a side view.

A warm-toned color filter layer comprises a red color filter layer or a magenta color filter layer; a cool-toned color filter layer comprises a blue color filter layer or a cyan color filter layer. The white light can become red or magenta after passing through the red color filter layer or the magenta color filter layer, which can neutralize a green color drift better. Of course, the color filter layer can also be another color filter layer that can change the color of light such as a yellow color filter layer or an orange color filter layer.

For example, a thickness of the tandem white OLED is 3 μm; a width of the white sub pixel (effective emission region) is 30 μm; and a viewing angle for a viewer with respect to the white sub pixel is 45 degree. The color drift in a side view (45 degree) in the technical solution without the color filter layer 2 and the color drift in the technical solution according to the present embodiment are shown in table 1.

TABLE 1

|  | CIEx | CIEy | u' | v' | Δu'v' |
|---|---|---|---|---|---|
| Front view | 0.277 | 0.281 | 0.190 | 0.435 |  |
| Side view (45 degree) | 0.261 | 0.280 | 0.179 | 0.432 | 0.012 |
| Side view after compensation | 0.276 | 0.290 | 0.186 | 0.440 | 0.007 |

The color drift value Δu'v' corresponding to the technical solution without the color filter layer 2 is 0.012; and the color drift value Δu'v' after compensation corresponding to the present embodiment is 0.007 that is obviously less than the 0.012 of the comparison example.

Figure 4:
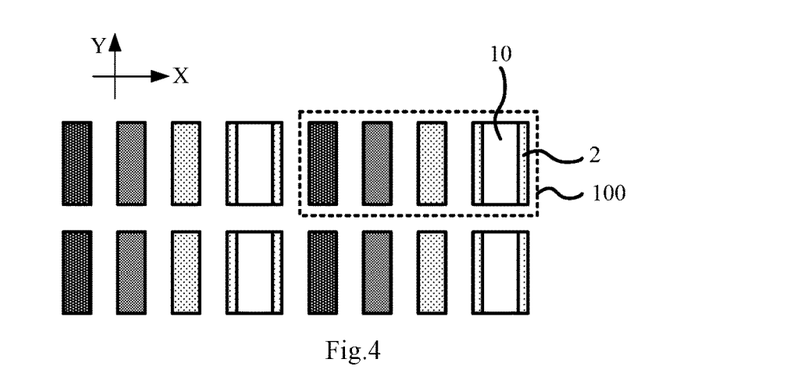
FIG. 4 is a top schematic view of a pixel according to an embodiment of the present disclosure.

As shown in FIG. 4, for example, the color filter layer 2 can be disposed outside and along two sides of the white sub pixel 10, which sides are parallel to the width direction of the display panel.

Each pixel 100 according to the present embodiment for example comprises four sub pixels of different colors that are red, green, blue and white. The length direction of the white sub pixel 10 (along Y direction as shown in the figure) is parallel to the width direction of the display panel.

Because the display panel is a widescreen conventionally and is provided with a large length to width ratio, a viewer in a side view only moves along the length direction (i.e., from left to right or from right to left along X direction as shown in the figure) usually. The color filter layer is only disposed outside and along the two sides of the white sub pixel, which sides are parallel to the width direction of the display panel in the present embodiment. Thus, with reducing the color drift, the luminance of the white light emitted from the white sub pixel can be kept as much as possible.

Figure 5:
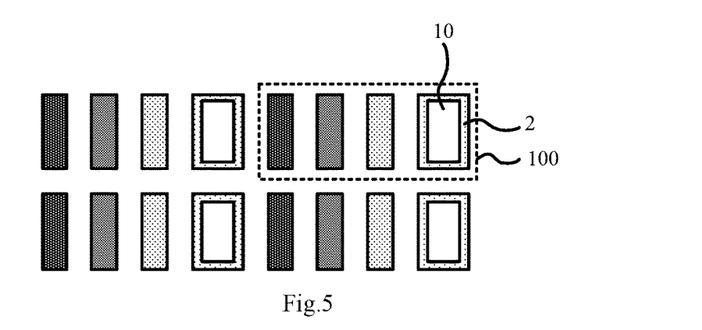
FIG. 5 is a top schematic view of a pixel according to another embodiment of the present disclosure.

As shown in FIG. 5, in another example, the color filter layer 2 can be disposed outside and along with every side of the white sub pixel 10, as shown in the figure; that is, four sides of the white sub pixel are surrounded by the color filter layer 2.

Each pixel 100 according to the present embodiment comprises four sub pixels of different colors that are red, green, blue and white. The length direction of the white sub pixel 10 is parallel to the width direction of the display panel.

During watching, a viewer may in left-right or up-down movement with respect to the display panel (for example, the slight of the viewer may be under the lower side of the display panel when the viewer sits on the floor; or the slight of the viewer may be higher than the upper side of the display panel when the viewer stands up). The present embodiment can ensure that the color drift of the tandem white OLED can be neutralized effectively to reduce the color drift when the viewer watches a white sub pixel at any angles.

For example, a thickness of the color filter layer 2 outside and along the two sides of the white sub pixel 10, which sides are parallel to the width direction of the display panel, is larger than a thickness of the color filter layer 2 disposed outside and along the two sides of the white sub pixel 10, which sides are parallel to the length direction of the display panel.

It can be seen from the two embodiments mentioned above that a viewer usually moves along the length direction of the display panel more, thus the color filter layer 2 outside and along the two sides of the white sub pixel 10, which sides are parallel to the width direction of the display panel, is formed thicker. This configuration can ensure a strong effect of reducing the color drift when the viewer in left-right movement. Thus the effect of reducing the color drift viewed at any angles and the luminance of the white sub pixel can be balanced.

Figure 6:
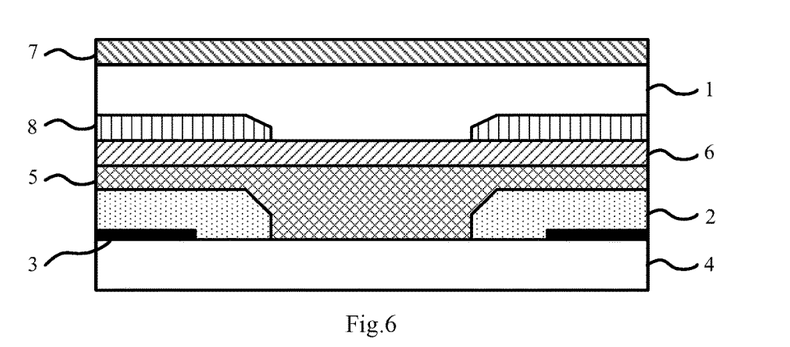
FIG. 6 is a structure schematic view of a display panel according to another embodiment of the present disclosure.

As shown in FIG. 6, for example, the display panel mentioned above further comprises a light-shield layer 3. The light-shield layer 3 is disposed between adjacent sub pixels and covered by the color filter layer 2. The width of a section of the light-shield layer 3 is less than the width of a section of the color filter layer as illustrated in the figure.

The light-shield layer 3 can avoid the interference of light of different colors emitted from adjacent sub pixels. The configuration that the width of a section of the light-shield layer is less than the width of a section of the color filter layer can reduce the white light that is shielded by the light-shield layer when the white sub pixel is viewed in a side view.

As shown in FIG. 1, the display panel further comprises a base substrate 4 and a planarization layer 5. The color filter layer 2 is disposed on the base substrate 4; and the planarization layer 5 is disposed on the color filter layer 2.

The white sub pixel comprises a first electrode layer 6 and a second electrode layer 7. The first electrode layer 6 is disposed on the planarization layer 5. The tandem white OLED 1 is disposed on the first electrode layer 6. The second electrode layer 7 comprises a reflective material and is disposed on the tandem white OLED 1.

The display panel in the present embodiment has a bottom-emitting structure. The second electrode layer can be used as a reflective layer. Of course, the second electrode layer can also be disposed as a transparent electrode according to requirements; and a reflective layer is additionally disposed on the second electrode layer. Light emitted from the tandem white OLED to the direction of second electrode can be reflected along the direction towards the first base substrate by the reflective layer to realize the bottom emitting.

For example, the display panel further comprises a pixel defining layer 8. The pixel defining layer 8 is disposed on first electrode layer 6 and is covered by the tandem white OLED 1 (as shown in FIG. 1); or the pixel defining layer 8 is disposed on the color filter layer 2 and is covered by the planarization layer 5 to define an effective emission region 80 of the white sub pixel.

For example, the color filter layer 2 is disposed under the pixel defining layer 8. An inner edge of the color filter layer 2 and an inner edge of the corresponding pixel defining layer 8 are disposed in a same plane (refer to the plane indicted by a dash line FIG. 1), that is, are aligned in the direction perpendicular to the base substrate. This configuration ensures that the color filter layer is disposed outside and along at least one side of the white sub pixel. And when a viewer watches the white sub pixel vertically, the light emitted from the white sub pixel does not pass through the color filter layer before entering the viewer's eyes. When a viewer watches not vertically, the light emitted from the white sub pixel passes through the color filter layer before entering the viewer's eyes of the viewer. Thus the effect of compensating color drift caused by the color filter layer is ensured as much as possible.

Figure 7:
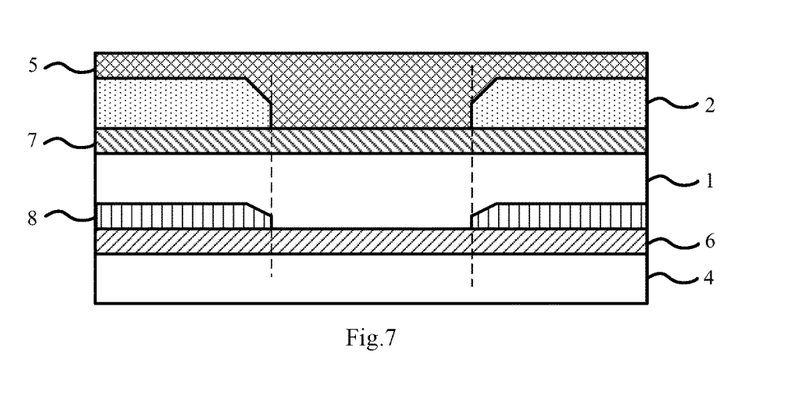
FIG. 7 is a structure schematic view of a display panel according to another embodiment of the present disclosure.

As shown in FIG. 7, for example, the display panel further comprises a base substrate 4. The white sub pixel comprises a first electrode layer 6 and a second electrode layer 7. The first electrode layer 6 is disposed on the base substrate 4. The tandem white OLED 1 is disposed on the first electrode layer 6. The first electrode layer 6 comprises a reflective material. The second electrode layer 7 is disposed on the tandem white OLED 1. The color filter layer 2 is disposed on the second electrode layer 7. A planarization layer 5 can be further disposed on the color filter layer 2 to protect the base substrate and so on.

The display panel in the present embodiment has a top-emitting structure. The first electrode layer can be used as a reflective layer. Of course, the first electrode layer can also be disposed as a transparent electrode according to requirements; and a reflective layer is additionally disposed on the first electrode layer. Light emitted from the tandem white OLED along the direction towards the first electrode can be reflected to the second base substrate by the reflective layer to realize the top emitting.

For example, the display panel further may comprise a pixel defining layer. The pixel defining layer is disposed on the second electrode layer and under the color filter layer (as shown in FIG. 7); or the pixel defining layer is disposed on the tandem white OLED and under the second electrode layer. For example, the color filter layer is disposed on the pixel defining layer. And an inner edge of the color filter layer and an inner edge of the corresponding pixel defining layer are disposed in a same plane (the plane indicted by a dash line in FIG. 7), that is, are aligned in the direction perpendicular to the base substrate.

A display device according to embodiments of the present disclosure comprises the display panel mentioned above.

It should be noted that, the display device according to the embodiment can be any product or component having a display function such as electronic paper, mobile phone, tablet computer, television, liquid crystal display panel, laptop computer, digital photo frame, navigator or the like.

Figure 8:
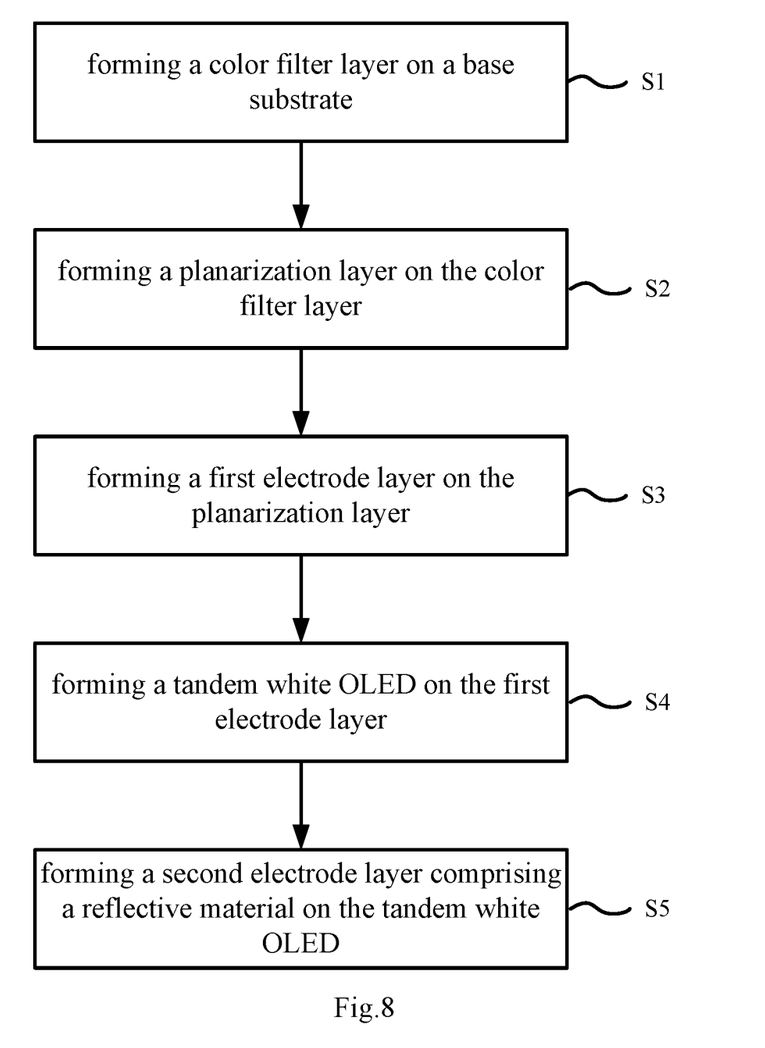
FIG. 8 is a flow diagram of fabricating a display panel according to an embodiment of the present disclosure.

As shown in FIG. 8, a fabricating method of a display panel according to an embodiment of the present disclosure comprises the following steps:

Step S1: forming a color filter layer on a base substrate; and

Step S2: forming a planarization layer on the color filter layer.

For example, the color filter layer can be formed by coating a colored resin layer and then patterning the colored resin layer to obtain a pattern by a photolithography process; alternatively, the color filter layer can be formed by coating a colored photoresist layer and obtaining a pattern through an exposing process and a developing process.

The fabricating method further comprises forming a white sub pixel on the planarization layer, and this process of forming the white sub pixel comprises the following steps:

Step S3: forming a first electrode layer on the planarization layer;

Step S4: forming a tandem white OLED on the first electrode layer; and

Step S5: forming a second electrode layer comprising a reflective material on the tandem white OLED.

The tandem white OLED comprises a plurality of light emitting layers that are stacked sequentially, for example, a red light emitting layer, a green light emitting layer, and a blue light emitting layer, but embodiments of the present disclosure are not limited thereto.

In an example, before forming the tandem white OLED, the method may further comprise: forming a pixel defining layer on the first electrode layer, to define an effective emission region of the white sub pixel. Or, in another example, before forming the planarization layer, the method further comprises: forming a pixel defining layer on the color filter layer, to define an effective emission region of the white sub pixel.

For example, forming the pixel defining layer may comprise: allowing an inner edge of the pixel defining layer and an inner edge of the corresponding color filter layer to be disposed in a same plane.

Figure 9:
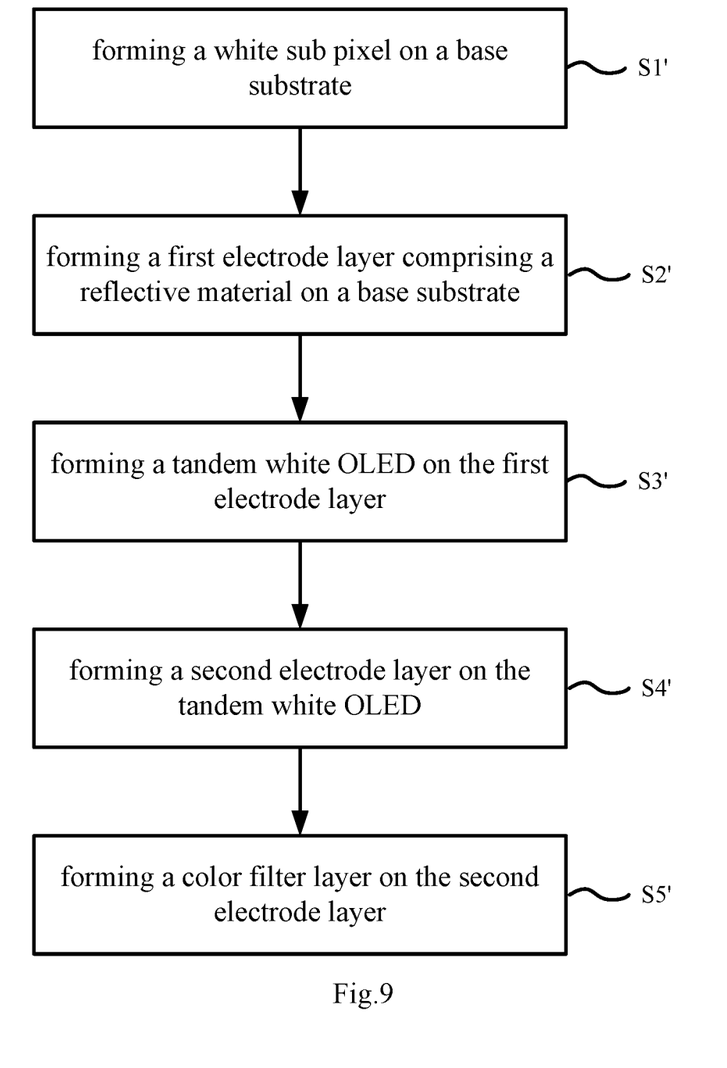
FIG. 9 is a flow diagram of fabricating a display panel according to an embodiment of the present disclosure.

As shown in FIG. 9, a fabricating method of a display panel according to another embodiment of the present disclosure comprises the following steps:

Step S1': forming a white sub pixel on a base substrate.

For example, the process of forming the white sub pixel comprises:

Step S2': forming a first electrode layer comprising a reflective material on a base substrate;

Step S3': forming a tandem white OLED on the first electrode layer;

Step S4': forming a second electrode layer on the tandem white OLED; and

Step S5': forming a color filter layer on the second electrode layer.

For example, before forming the color filter layer, the fabricating method may further comprise: forming a pixel defining layer on the second electrode layer; or, before forming the second electrode layer, the fabricating method may further comprise: forming a pixel defining layer on the tandem white OLED.

For example, the process of forming the color filter layer comprises: allowing an inner edge of the color filter layer and an inner edge of the corresponding pixel defining layer to be disposed in a same plane.

The forming process applied in the steps mentioned above comprises, for instance, film forming processes, such as depositing and sputtering, and patterning processes such as etching.

The technical solutions of embodiments of the present disclosure are detailed described in combination with the drawings above. In the conventional technology, when the white sub pixel provided with a tandem white OLED is viewed, an effect of color drift exists. With the technical solutions of the present disclosure, if a viewer watches a white sub pixel of the display panel in a side view (not vertically), light emitted from the white sub pixel of the display panel passes through the color filter layer before entering the viewer's eyes. Thus the viewer can see part of the light with the color corresponding to the color filter layer. Because color drift exists when the white sub pixel provided with a tandem white OLED is viewed, the light with the color corresponding to the color filter can neutralize at least part of the color drift. Thus the color drift is reduced and the viewing effect is improved.

What are described above is related to the illustrative embodiments of the disclosure only and not limitative to the scope of the disclosure. Therefore, the scopes of the disclosure are defined by the accompanying claims.

The present application claims the priority of the Chinese Patent Application No. 201610005160.4 filed on Jan. 5, 2016, which is incorporated herein in its entirety by reference as part of the disclosure of the present application.

What is claimed is:

1. A display panel, comprising a plurality of pixels, wherein, each pixel comprises:
   a white sub pixel comprising a tandem white organic light emitting diode (OLED); and
   a color filter layer, disposed at a light exit side of the white sub pixel and disposed outside and along at least one side of the white sub pixel,
   wherein the display panel further comprises a base substrate, and an orthographic projection of the color filter layer on the base substrate is within an orthographic projection of the tandem white organic light emitting diode on the base substrate.

2. The display panel according to claim 1, wherein, a blue band light component of white light emitted from the tandem white OLED is stronger than other light components of the white light emitted from the tandem white OLED, and the color filter layer is configured to be a cool-toned color filter layer; or
   a green band light component of the white light emitted from the tandem white OLED is stronger than other light components of the white light emitted from the tandem white OLED, and the color filter layer is configured to be a warm-toned color filter layer.

3. The display panel according to claim 1, wherein, the color filter layer is disposed outside and along two sides of the white sub pixel, which sides are parallel to a width direction of the display panel.

4. The display panel according to claim 1, wherein, the color filter layer is disposed outside and along with every side of the white sub pixel.

5. The display panel according to claim 4, wherein, a thickness of the color filter layer disposed outside and along two sides of the white sub pixel, which sides are parallel to a width direction of the display panel, is larger than a thickness of the color filter layer disposed outside and along two sides of the white sub pixel, which sides are parallel to a length direction of the display panel.

6. The display panel according to claim 1, further comprising:
   a light-shield layer, which is disposed between adjacent sub pixels and covered by the color filter layer, wherein, a width of a section of the light-shield layer is less than a width of a section of the color filter layer.

7. The display panel according to claim 1, further comprising a planarization layer, disposed on the color filter layer, wherein the color filter layer is disposed on the base substrate, and
   wherein the white sub pixel further comprises:
   a first electrode layer, disposed on the planarization layer, wherein the tandem white OLED is disposed on the first electrode layer, and
   a second electrode layer, comprising a reflective material and disposed on the tandem white OLED.

8. The display panel according to claim 7, further comprising:
   a pixel defining layer, disposed on the first electrode layer and covered by the tandem white OLED, or disposed on the color filter layer and covered by the planarization layer, wherein the pixel defining layer is configured for defining an effective emission region of the white sub pixel.

9. The display panel according to claim 8, wherein, the color filter layer is disposed under the pixel defining layer, and an inner edge of the color filter layer and an inner edge of the pixel defining layer are disposed in a same plane.

10. The display panel according to claim 1, wherein, the white sub pixel further comprises:
a first electrode layer, disposed on the base substrate, wherein the tandem white OLED is disposed on the first electrode layer, and the first electrode layer comprises a reflective material; and
a second electrode layer, disposed on the tandem white OLED, wherein the color filter layer is disposed on the second electrode layer.

11. The display panel according to claim 10, further comprising:
a pixel defining layer, disposed on the second electrode layer and under the color filter layer, or disposed on the tandem white OLED and under the second electrode layer.

12. The display panel according to claim 11, wherein the color filter layer is disposed on the pixel defining layer, and an inner edge of the color filter layer and an inner edge of the pixel defining layer are disposed in a same plane.

13. A display device, comprising the display panel according to claim 1.

14. A fabricating method of a display panel, comprising:
forming a color filter layer on a base substrate;
forming a planarization layer on the color filter layer; and
forming a white sub pixel on the planarization layer,
wherein the forming the white sub pixel comprises:
forming a first electrode layer on the planarization layer;
forming a tandem white organic light emitting diode (OLED) on the first electrode layer; and
forming a second electrode layer comprising a reflective material on the tandem white OLED, wherein an orthographic projection of the color filter layer on the base substrate is within an orthographic projection of the tandem white organic light emitting diode on the base substrate.

15. The method according to claim 14, before forming the tandem white OLED, further comprising:
forming a pixel defining layer on the first electrode layer, to define an effective emission region of the white sub pixel;
or before forming the planarization layer, the method further comprising:
forming a pixel defining layer on the color filter layer, to define an effective emission region of the white sub pixel.

16. The method according to claim 15, wherein an inner edge of the pixel defining layer and an inner edge of the color filter layer are disposed in a same plane.

17. A fabricating method of a display panel, comprising:
forming a first electrode layer comprising a reflective material on a base substrate;
forming a tandem white OLED on the first electrode layer;
forming a second electrode layer on the tandem white OLED; and
forming a color filter layer on the second electrode layer, wherein an orthographic projection of the color filter layer on the base substrate is within an orthographic projection of the tandem white OLED on the base substrate.

18. The method according to claim 17, before forming the color filter layer, further comprising:
forming a pixel defining layer on the second electrode layer;
or before forming the second electrode layer, the method further comprising:
forming a pixel defining layer on the tandem white OLED.

19. The method according to claim 18, wherein an inner edge of the color filter layer and an inner edge of the pixel defining layer are disposed in a same plane.

20. The display panel according to claim 1, wherein the tandem white OLED comprises a plurality of light-emitting layer that are sequentially stacked between an anode and a cathode, and light from the light-emitting layers is mixed to obtain white light or substantially white light.

* * * * *